(12) United States Patent
Haapamäki

(10) Patent No.: US 8,132,614 B2
(45) Date of Patent: Mar. 13, 2012

(54) ARRANGEMENT FOR THE COOLING OF LIQUID-COOLED ELECTRICAL EQUIPMENT

(75) Inventor: Tapani Haapamäki, Laihia (FI)

(73) Assignee: Vacon Oyi, Vaasa (FI)

( * ) Notice: Subject to any disclaimer, the term of this patent is extended or adjusted under 35 U.S.C. 154(b) by 1201 days.

(21) Appl. No.: 11/514,179

(22) Filed: Sep. 1, 2006

(65) Prior Publication Data

US 2007/0084227 A1 Apr. 19, 2007

(30) Foreign Application Priority Data

May 9, 2005 (FI) ...................................... 20055473

(51) Int. Cl.
*F24H 3/00* (2006.01)
*F24F 3/00* (2006.01)
*B60H 1/00* (2006.01)
*F25D 23/12* (2006.01)
*H05K 5/00* (2006.01)
*A47B 81/00* (2006.01)
*A47B 91/00* (2006.01)

(52) U.S. Cl. .......... 165/47; 165/11.1; 165/50; 165/80.4; 62/259.2; 361/724; 312/223.1; 312/351.1

(58) Field of Classification Search ............. 165/104.33, 165/50, 11.1, 47, 96, 80.4, 80.5; 62/259.2; 361/99, 724; 52/220.1; 312/223.1–223.6, 312/351.1, 351.14
See application file for complete search history.

(56) References Cited

U.S. PATENT DOCUMENTS

| | | | | |
|---|---|---|---|---|
| 321,905 A * | 7/1885 | Lutomski | ........................ | 285/13 |
| 4,874,127 A * | 10/1989 | Collier | ........................ | 236/49.5 |
| 4,930,544 A * | 6/1990 | Ziu | ........................ | 138/113 |
| 5,566,881 A * | 10/1996 | Inoue et al. | ............... | 237/12.3 B |
| 5,718,628 A * | 2/1998 | Nakazato et al. | ............. | 454/184 |
| 5,871,042 A | 2/1999 | Gutfeldt et al. | | |
| 6,061,982 A * | 5/2000 | Owen | ........................ | 52/220.1 |
| 2005/0117297 A1 * | 6/2005 | Nicolai et al. | ................ | 361/699 |

FOREIGN PATENT DOCUMENTS

| | | |
|---|---|---|
| EP | 0 253 206 A2 | 1/1988 |
| EP | 0 300 405 A2 | 1/1989 |
| EP | 0 361 196 A1 | 4/1990 |
| EP | 1 298 975 A2 | 4/2003 |
| FR | 2876812 A1 * | 4/2006 |
| JP | 09-117091 A | 5/1997 |

* cited by examiner

*Primary Examiner* — Cheryl J Tyler
*Assistant Examiner* — Travis Ruby
(74) *Attorney, Agent, or Firm* — Birch, Stewart, Kolasch & Birch, LLP

(57) ABSTRACT

An arrangement for cooling of liquid-cooled electric devices, the arrangement being fitted to convey heat produced in the electric devices (3) away from the electric device by means of a liquid flowing through a cooling element of the electric device. The arrangement includes an instrument cubicle (1) with one or more electric devices (3) placed in it, a cooling apparatus (6*ca*), an inlet piping (10) and an outlet piping (11) connecting the electric device and the cooling apparatus for conveying a cooling liquid into the cooling element and out of the cooling element of the electric device (3). Below the instrument cubicle (1) is a footing element (2) housing an inlet main pipe (20) and outlet main pipe (21) connected to the cooling apparatus (6*ca*), the inlet piping (10) and outlet piping (11) being detachably connected to the main pipes. The arrangement enables indication of leakage situations occurring in the pipings.

19 Claims, 4 Drawing Sheets

ARRANGEMENT FOR THE COOLING OF LIQUID-COOLED ELECTRICAL EQUIPMENT

FIELD OF THE INVENTION

The present invention relates to liquid cooling of electric apparatus, especially adjustable electric drives, cooled by the application of a liquid. Such liquid cooling protects the electric apparatus by enabling a maximal cooling efficiency.

BACKGROUND OF THE INVENTION

Liquid cooling has been applied to some extent to the cooling of electric apparatus, such as adjustable electric drives.

A liquid cooling system in which water is circulated to conduct heat away from an electric device has to be implemented in a way that makes it possible to ensure that the system will withstand the pressure caused by the water and that it will also endure forces applied to it without letting the water come into contact with the electric circuits in the event of a leakage.

The water used for the cooling may contain impurities, which may impair the cooling efficiency as blockages develop in the cooling ducts. Accumulation of air may also occur in the ducts, which is difficult to detect and may also lead to a reduced cooling efficiency.

Conventional liquid cooling arrangements are fixed structures inside or behind the equipment, which are connected e.g. by welding and whose installation and maintenance are difficult to carry out.

BRIEF DESCRIPTION OF THE INVENTION

The object of the present invention is to provide a reliable liquid cooling arrangement for liquid-cooled electric apparatus and in particular for an adjustable electric drive, an arrangement that can be more easily maintained and expanded.

This is achieved by using an arrangement for liquid cooling of electric apparatus that has the features according to the present invention as defined in the claims. In more precise terms, this arrangement of the invention is characterized by what is disclosed in the characterization part of the independent claim.

Preferred embodiments of the invention are presented in the dependent claims.

It is an object of the invention to provide an arrangement adapted to conduct heat produced in electric devices away from the electric device by means of a liquid flowing through a cooling element of the electric device. The arrangement comprises an instrument cubicle containing one or more electric devices, a cooling apparatus, inlet piping and outlet piping connecting the electric device and the cooling apparatus for conveying a cooling liquid into the cooling element and out of the cooling element. Arranged below the instrument cubicle is a footing element, which comprises an inlet main pipe and an outlet main pipe connected to the cooling apparatus, the inlet piping and outlet piping being detachably connected to these main pipes. Maintenance of the arrangement is easy as the footing element is mounted below the instrument cubicle. The ease of maintenance of the footing element arrangement also improves the control of leakages, because the arrangement allows repair and easy replacement of parts. Moreover, the liquid cooling arrangement can be implemented as a distinctly separate unit, which can be expanded independently of the electric devices above it as far as the diameters of the inlet main pipe and outlet main pipe and the power of the cooling apparatus permit the addition of liquid-cooled devices.

According to an aspect of the invention, the arrangement comprises a further protective pipe of larger diameter placed around the inlet piping and outlet piping and fitted to conduct the cooling liquid away from the vicinity of the electric device in a leakage situation. As the leaking cooling liquid is conducted below the electric devices, possible leakages will not involve an immediate risk.

According to a second aspect of the invention, the footing element further comprises an indication main pipe and connection means for receiving the protective pipe into the indication main pipe, which conveys the cooling liquid in a leakage situation to a selected location.

According to yet another aspect of the invention, the indication main pipe receives the protective pipes of both the inlet piping and the outlet piping. This arrangement makes it possible to detect leakage situations of both piping systems by means of a single indication main pipe. By extending the one indication pipe, it can be utilized for the protection of the instrument cubicles in a plurality of switch bays in the same way as the inlet main pipe and outlet main pipe can be utilized for the cooling of the electric devices in a plurality of instrument cubicles.

According to an aspect of the invention, the inlet main pipe and outlet main pipe of the footing element are extended with a jointing sleeve so as to allow one footing element having a corresponding structure to be placed beside the instrument cubicle.

According to an aspect of the invention, the indication main pipe is likewise extended with a connection piece so as to allow one footing element having a corresponding structure to be placed beside the instrument cubicle.

According to an aspect of the invention, the inlet main pipe and outlet main pipe of the footing element are terminated with a detachable end piece that can be replaced with a jointing sleeve so as to allow one footing element having a corresponding structure to be placed beside the instrument cubicle.

According to an aspect of the invention, the indication main pipe of the footing element is terminated with a detachable end piece that can be replaced with a jointing sleeve so as to allow one footing element having a corresponding structure to be placed beside the instrument cubicle. Each footing element can be mounted in its final mounting position before the installation of the instruments. This permits considerably faster installation of the liquid cooling system. The ends of the footing element may be provided with openings, through which the cabling between bays can also be implemented.

According to an aspect of the invention, the inlet main pipe and outlet main pipe of the footing element are terminated with an end piece that comprises venting means and exhaust means for exhausting and venting the inlet main pipe and outlet main pipe.

According to an aspect of the invention, the indication main pipe of the footing element is made of transparent material to allow easier detection of a possible leakage point.

BRIEF DESCRIPTION OF THE FIGURES

A preferred embodiment of the arrangement of the invention for the cooling of liquid-cooled electric devices is presented in the attached drawings, wherein.

DETAILED DESCRIPTION OF THE INVENTION

Figure 1:
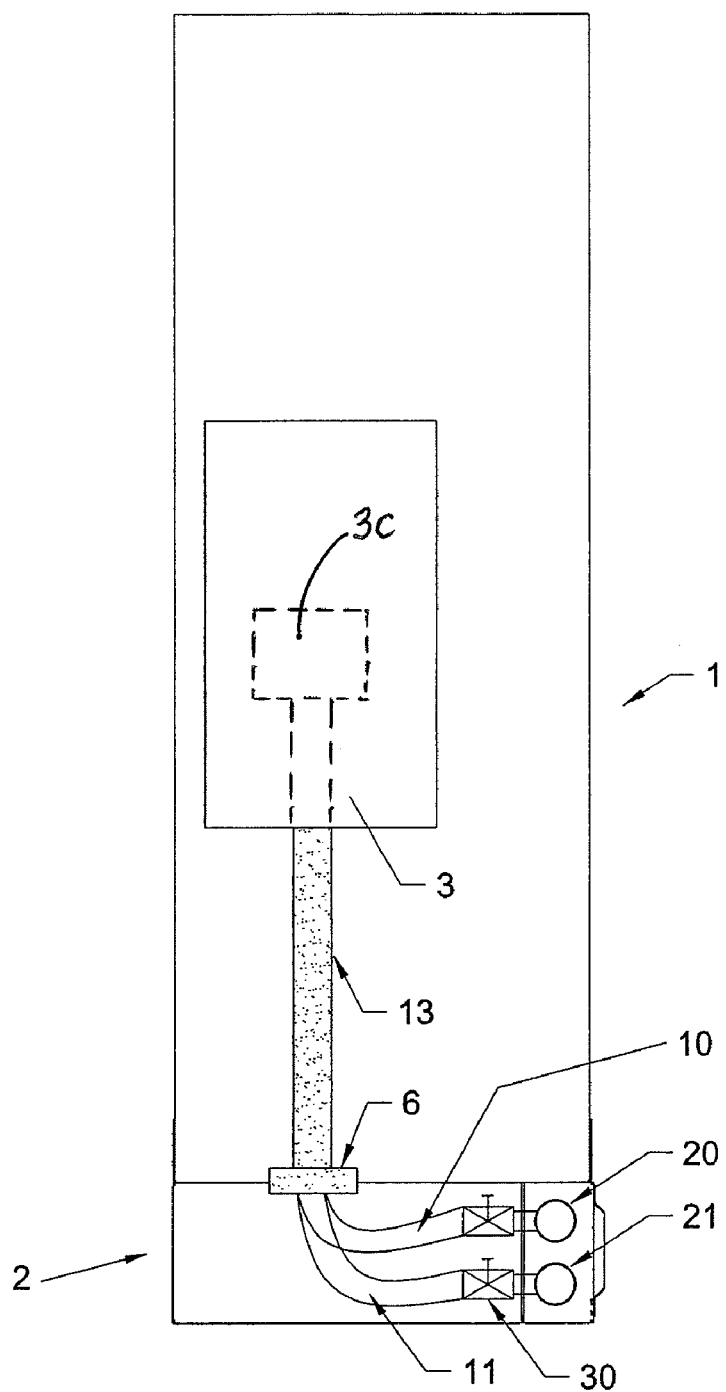
FIG. 1 presents a side view of an instrument cubicle and footing element according to a first embodiment of the arrangement of the invention.

FIG. 1 presents an instrument cubicle 1 and a footing element 2 arranged below it according to a first embodiment of the arrangement of the invention. Placed in the instrument cubicle is a liquid-cooled electric device 3.

The inlet piping 10 and the outlet piping 11 run inside protective pipes 13 in the instrument cubicle 1. The protective pipes 13 pass through the bottom of the instrument cubicle 1. The place where the pipes penetrate the bottom is provided with a sealing, which seals the lead-in and protects the protective pipe 13. After the lead-in, the inlet pipe 10 is connected to an inlet main pipe 20. The outlet pipe 11 is connected to an outlet main pipe 21. The main pipes can be made from stronger material, such as steel.

The connection can be implemented using a shut-off valve 30 or equivalent, allowing the pipes of the electric device to be connected and disconnected without having to completely close the liquid cooling of the whole system.

Figure 2:
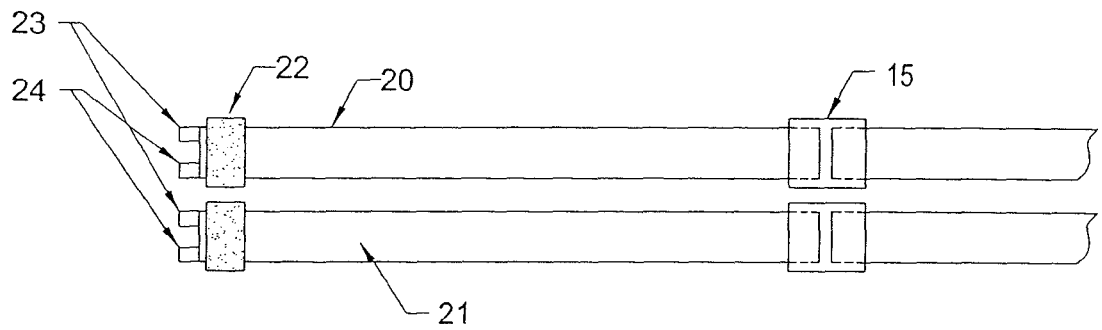
FIG. 2 presents a front view of an embodiment of the main pipes of the arrangement of the invention.

FIG. 2 presents an embodiment according to the invention regarding the arrangement of the main pipes within the footing element. In this case, the upper pipe is the inlet main pipe 20 and the lower pipe is the outlet main pipe 21. The inlet main pipe 20 and the outlet main pipe 21 are extended with a jointing sleeve 15 so as to allow a footing element of corresponding structure to be placed beside the instrument cubicle.

The inlet main pipe 20 and the outlet main pipe 21 of the footing element are terminated with a detachable end piece 22 that can be replaced with a jointing sleeve 15. The end piece 22 comprises venting means 23 and exhaust means 24 for exhausting and venting the inlet main pipe 20 and the outlet main pipe 21.

Figure 3:
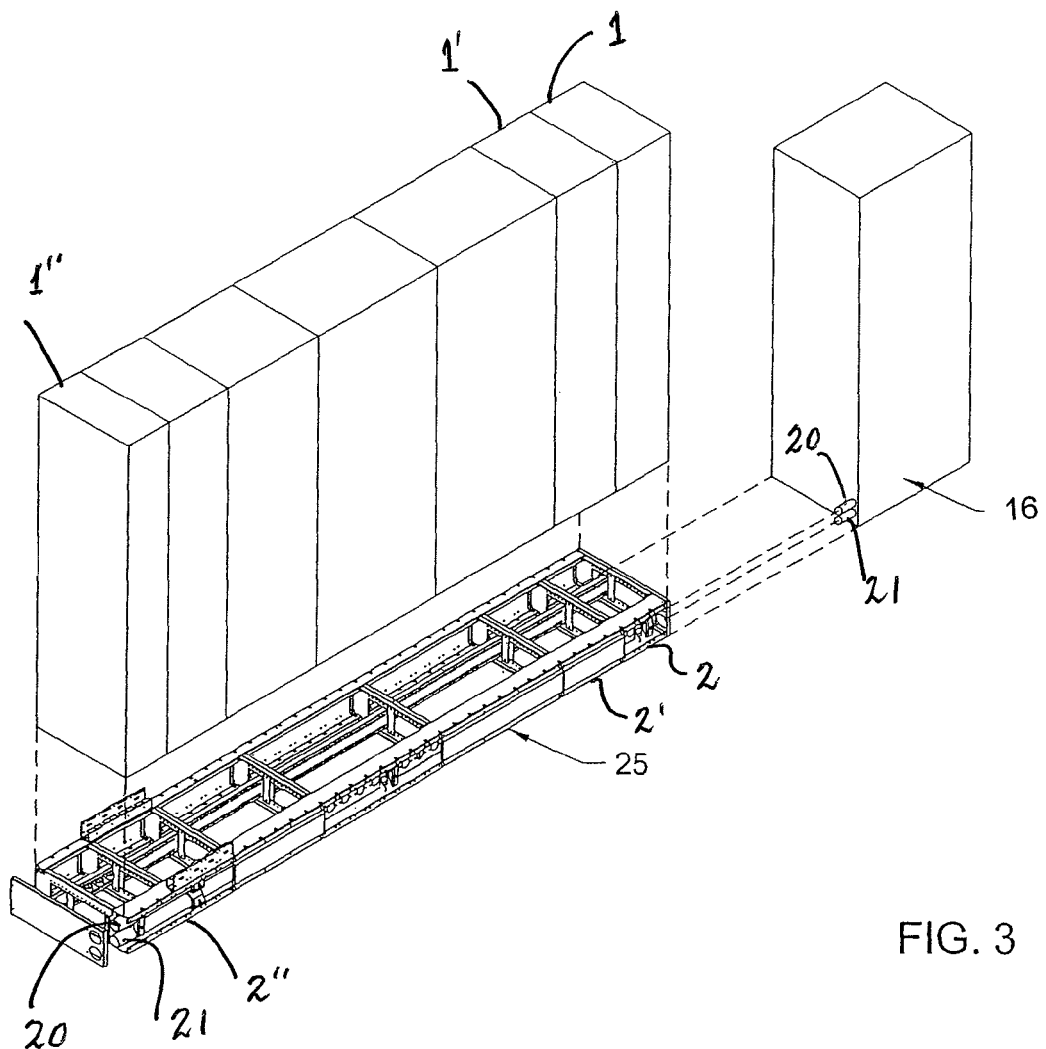
FIG. 3 presents an oblique top view of an embodiment of the arrangement of the invention in which a number of instrument cubicles are connected to the main piping line.

FIG. 3 presents an embodiment of the arrangement of the invention in which a plurality of instrument cubicles 1, 1', . . . 1" are connected to the main piping line. The cooling apparatus 16 is designed for the cooling of a plurality of electric devices. The apparatus 16 supplies a cooling medium to the cooling element 3c of each of the electric devices 3 and receives the liquid cooling medium coming from the cooling element 3c of each of the electric devices 3 (See also FIG. 1). A first rectangular box-shaped footing element 2 is arranged below the first instrument cubicle 1, a second rectangular box-shaped footing element 2' is arranged below the second instrument cubicle 1', and the nth rectangular box-shaped footing element 2" is arranged below the nth instrument cubicle 1". Cooling apparatus 16 is arranged so as to abut directly against a lateral side of first instrument cabinet 1 and the first rectangular box-shaped footing element 2. FIG. 3 also illustrates inlet main pipe 20 and an outlet main pipe 21 arranged inside the first rectangular box-shaped footing element 2, and extending in a lateral direction from the first rectangular box-shaped footing element 2 into a lower side portion 16s of the cooling apparatus 16.

An assembly of footing elements 2 as illustrated in FIG. 3 can be mounted in place before the installation of the instrument cubicles 1. Thus, the start-up installation of the electric devices can be carried out considerably faster, because the connections can be made directly to the footing, which can comprise the piping for liquid cooling ready installed. It should be noted that one instrument cubicle 1 may house one or more liquid-cooled electric devices 3. The outermost footing element can be provided with an end plate or equivalent. The front panel 25 of the footing element is also detachable. As the front panel 25 of the footing element is detachable, it will be easy to carry out mounting, maintenance and repair work on the piping and its joints. It can be seen from FIG. 3 how adjacent footing elements 2 of mutually corresponding structure also provide a space for a cable conduit. The arrangement of the invention saves space in that the footing element is provided with a cable conduit, which can be utilized for the electricity cabling of the devices. Likewise, the earth connection for electromagnetic compatibility of the cables can be made to the footing element.

Figure 4:
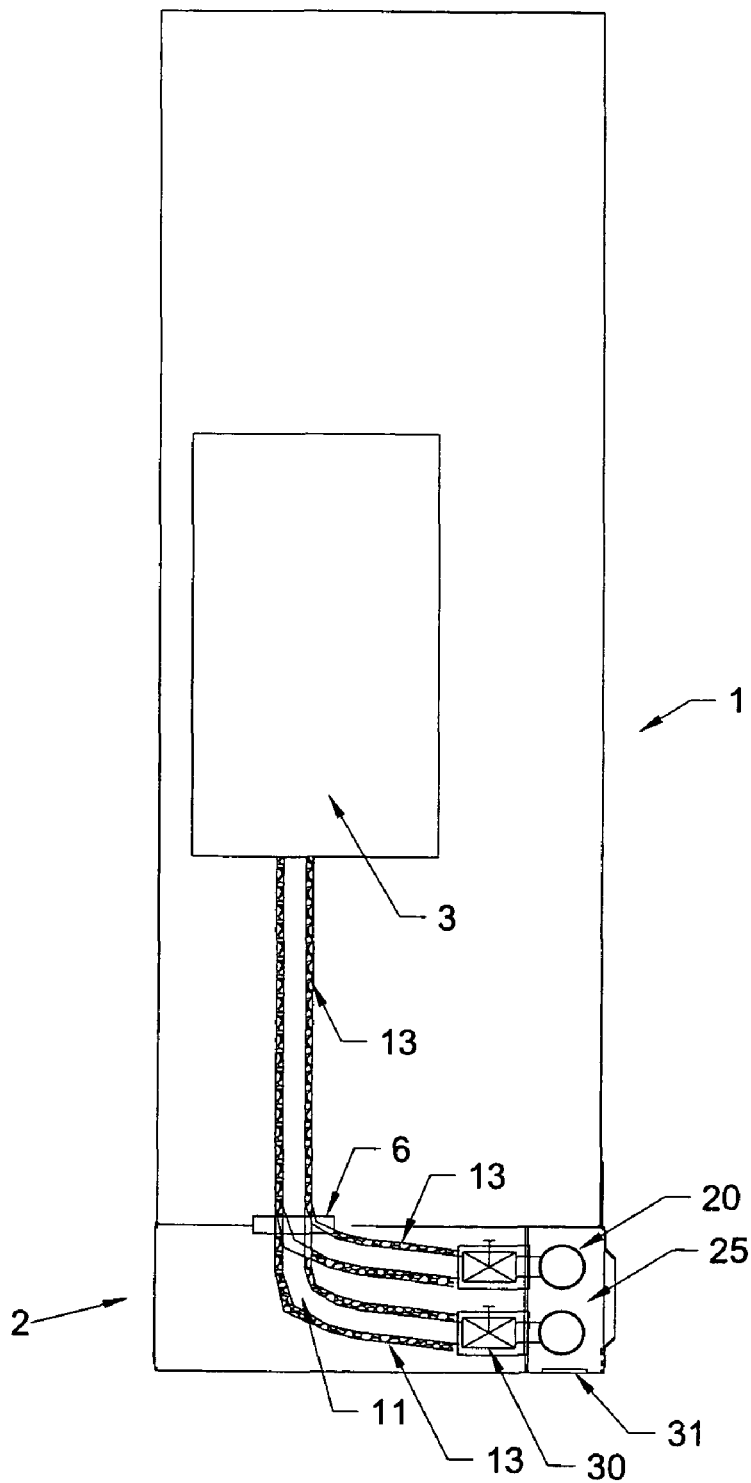
FIG. 4 presents a side view of an instrument cubicle and footing element according to a second embodiment of the arrangement of the invention.

FIG. 4 presents an instrument cubicle 1 according to a second embodiment of the arrangement of the invention and a footing element 2 arranged below it. Placed in instrument cubicle is a liquid-cooled electric device 3.

The inlet pipes 10 and outlet pipes 11 run inside protective pipes 13 in the instrument cubicle 1. The protective pipes 13 are separated from around the inlet and outlet pipes by a grommet seal 6 at the point where the pipes are passed through the bottom of the instrument cubicle 1. The point of penetration of the bottom is provided with a grommet seal 6 fitted for isolation, sealing the lead-in and protecting the pipes in connection with the lead-through. The inlet pipe 10 and the outlet pipe 11 run as continuous pipes through the grommet seal 6. The protective pipes 13 are received above the lead-in point into the grommet seal 6 around the inlet pipe 10 and the outlet pipe 11. Below the grommet seal 6 at the lead-in point, the protective pipes 13 are separated from around the inlet pipe 10 and outlet pipe 11. After the lead-in, the inlet pipe 10 and outlet pipe 11 are connected to the inlet main pipe 20 and outlet main pipe 21, respectively, via a shut-off valve 30.

In FIG. 4, the shut-off valve 30 has a protective socket or an equivalent protective casing, to which the protective pipes 13 are connected. The protective pipe 13 and protective socket extend right into the main pipe space. The protective socket is movable so as to permit access to the shut-off valve when necessary. In FIG. 4, the bottom of the footing element is provided with a moisture indicator 31, the function of which is to detect possible moisture caused by a leakage. The moisture indicator may also generate an alarm in the event of leakage. Utilizing the alarm produced by the moisture indicator 31, it is possible to implement automatic closure or adjustment of shut-off valves 30, control valve or equivalent. It is to be noted that the moisture indicator 31 may be placed at different positions. In FIG. 4, the moisture indicator 31 is placed on the floor or on the bottom of the footing element, but it may just as well be placed in conjunction with the shut-off valve 30 or even in the grommet seals 6, in which case it is even possible to implement device-specific leakage control.

Figure 5:
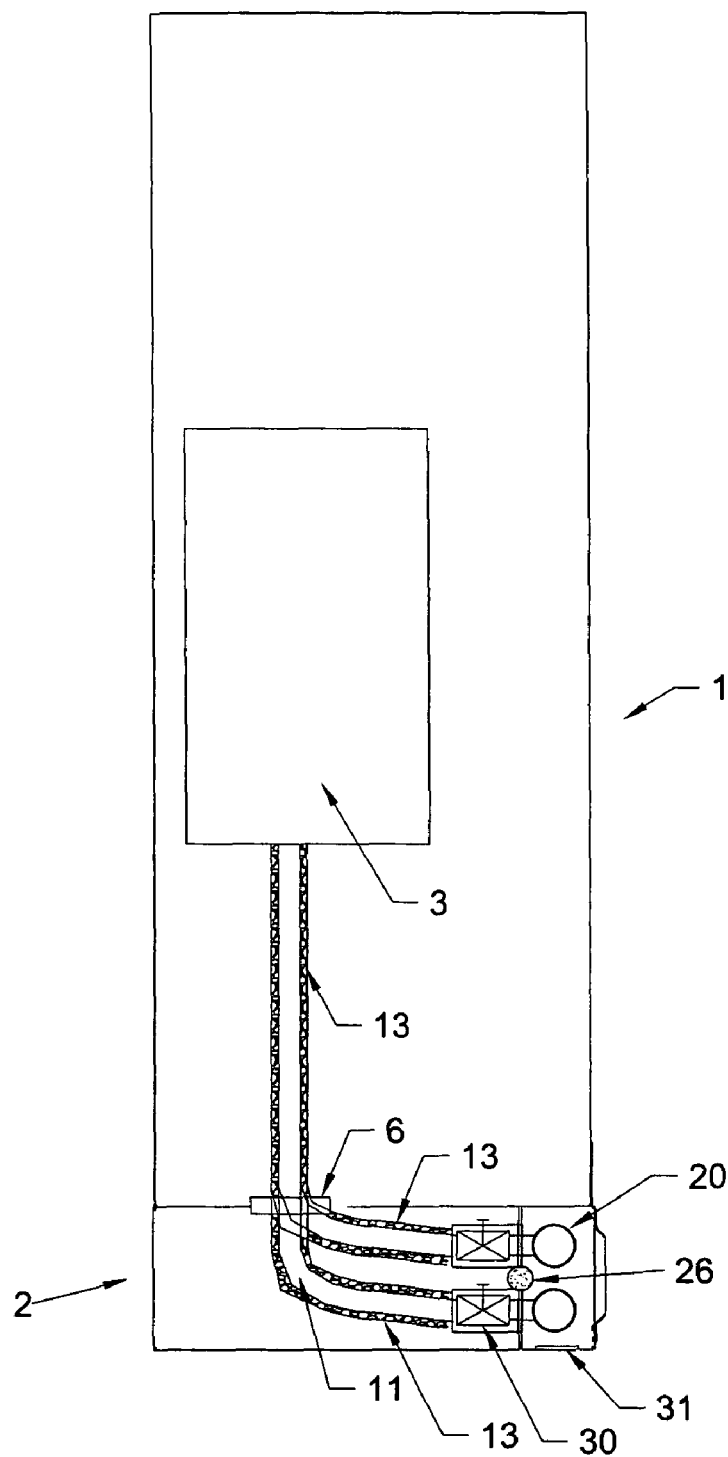
FIG. 5 presents a side view of an instrument cubicle and footing element according to a third embodiment of the arrangement of the invention.

FIG. 5 presents an instrument cubicle 1 and footing element 2 placed below it according to a third embodiment of the arrangement of the invention. According to this third embodiment, the footing element further comprises an indication main pipe 26 and connection means for receiving the protective pipe 13 into the indication main pipe 26. In a leakage situation, the indication main pipe 26 conveys the cooling liquid into a selected location. The indication main pipe 26 receives the protective pipes 13 of both the inlet pipe 10 and the outlet pipe 11. Thus, a single indication main pipe 26 is sufficient to detect leakages from both pipes. The indication main pipe 26 can also be utilized for the protection of the instrument cubicles of a plurality of switch bays in the same way as the inlet main pipe 20 and outlet main pipe 21 can be utilized for the cooling of the electric devices in a plurality of instrument cubicles.

It is to be understood that the above description and the associated figures are only meant to visualize the present invention. Thus, the invention is not exclusively limited to the embodiment described above or defined in the claims; instead, it will be obvious to persons skilled in the art that different variations and modifications of the invention are possible within the scope of the inventive concept defined in the claims.

The invention claimed is:

1. An arrangement for the cooling of one or more liquid cooled electric devices (3), said arrangement being fitted to convey heat produced in the one or more electric devices (3) away from the one or more electric devices (3) by means of a liquid flowing through a cooling element (3c) of each of the one or more electric devices (3), said arrangement comprising:
    a first instrument cubicle (1) with one or more electric devices (3) placed therein,
    a first rectangular box-shaped footing element (2) arranged below the first instrument cubicle (1),
    a cooling apparatus (16) arranged so as to abut against a lateral side of the first instrument cabinet (1) and a lateral side of the first rectangular box-shaped footing element (2),
    an inlet main pipe (20) and an outlet main pipe (21) arranged inside the first rectangular box-shaped footing element (2), and extending in a lateral direction from the first rectangular box-shaped footing element (2) into a lower side portion (16s) of the cooling apparatus (16),
    an inlet piping (10) detachably connected to the inlet main pipe (20), the inlet piping (10) and the inlet main pipe (20) connecting the cooling element (3c) of each of the one or more electric devices (3) and the cooling apparatus (16) for conveying a cooling liquid into the cooling element (3c) of each of the one or more electric devices (3),
    an outlet piping (11) detachably connected to the outlet main pipe (21), the outlet piping (11) and the outlet main pipe (21) connecting the cooling element (3c) of each of the one or more electric devices (3) and the cooling apparatus (16) for conveying a cooling liquid out of the cooling element (3c) of each of the one or more electric devices (3), and
    a grommet seal (6) sealing an outside of the inlet piping (10) and outlet piping (11) between the first instrument cubicle (1) and the first rectangular box-shaped footing element (2) arranged below the first instrument cubicle (1),
    wherein the inlet piping (10) and the outlet piping (11) are detachably connected to circumferential sides of the main pipes (20, 21), curve upwardly to pass through the grommet seal (6) between the first instrument cubicle (1) and the first rectangular box-shaped footing element (2), and then extend upwardly to a bottom side of the cooling element (3c) of each of the one or more electric devices (3).

2. The arrangement according to claim 1, wherein the arrangement comprises a protective pipe (13) placed around each of the inlet piping (10) and the outlet piping (11) and fitted to convey the cooling liquid away from the vicinity of the one or more electric devices (3) in a leakage situation.

3. The arrangement according to claim 2, wherein the footing element (2) further comprises an indication main pipe (26) and connection means for receiving the protective pipe (13) into the indication main pipe (26), which conveys the cooling liquid in a leakage situation to a selected location,
    wherein the protective pipe (13) placed around the inlet piping (10) and outlet piping (11) passes through and is sealed by the grommet seal (6) between the first instrument cubicle (1) and the first rectangular box-shaped footing element (2).

4. The arrangement according to claim 3, wherein the indication main pipe (26) is extended with a jointing sleeve (15) so as to allow a second rectangular box-shaped footing element (2') of a second instrument cubicle (1') to be placed beside and abut directly against the first rectangular box-shaped footing element (2) below the first instrument cubicle (1).

5. The arrangement according to claim 3, wherein the indication main pipe (26) receives both the protective pipe (13) of both the inlet piping (10) and the protective pipe (13) of the outlet piping (10).

6. The arrangement according to claim 3, wherein the inlet main pipe (20) and outlet main pipe (21) of the first rectangular box-shaped footing element (2) are extended with a jointing sleeve (15) so as to allow a second box-shaped footing element (2') below a second instrument cubicle (1') to be placed beside and abut directly against the first rectangular box-shaped footing element (2) below the first instrument cubicle (1).

7. The arrangement according to claim 3, wherein the inlet main pipe (20) and outlet main pipe (21) of the first rectangular box-shaped footing element (2) are terminated with a detachable end piece that can be replaced with a jointing sleeve (15) so as to allow a second rectangular box-shaped footing element (2') below a second instrument cubicle (1') to be placed beside and abut directly against the first rectangular box-shaped footing element (2) below the first instrument cubicle (1).

8. The arrangement according to claim 2, further comprising an indication main pipe (26) disposed in the first rectangular box-shaped footing element (2) for receiving both the protective pipe (13) of both the inlet piping (10) and the protective pipe (13) of the outlet piping (10).

9. The arrangement according to claim 8, wherein the inlet main pipe (20) and outlet main pipe (21) of the first rectangular box-shaped footing element (2) are extended with a jointing sleeve (15) so as to allow a second rectangular box-shaped footing element (2') below a second instrument cubicle (1') to be placed beside and abut directly against the first rectangular box-shaped footing element (2) below the first instrument cubicle (1).

10. The arrangement according to claim 8, wherein the indication main pipe is extended with a jointing sleeve (15) so as to allow a second rectangular box-shaped footing element (2') below a second instrument cubicle (1') to be placed beside and abut directly against the first rectangular box-shaped footing element (2) below the first instrument cubicle (1).

11. The arrangement according to claim 8, wherein the inlet main pipe (20) and outlet main pipe (21) of the first rectangular box-shaped footing element (2) are terminated with a detachable end piece that can be replaced with a jointing sleeve (15) so as to allow a second rectangular box-shaped footing element (2') below a second instrument cubicle (1') to be placed beside and abut directly against the first rectangular box-shaped footing element (2) below the first instrument cubicle (1).

12. The arrangement according to claim 2, wherein an indication main pipe (26) receives both the protective pipe (13) of both the inlet piping (10) and the protective pipe (13) of the outlet piping (10).

13. The arrangement according to claim 2, wherein the inlet main pipe (20) and outlet main pipe (21) of the first rectangular box-shaped footing element (2) are extended with a jointing sleeve (15) so as to allow a second rectangular box-shaped footing element (2') below a second instrument cubicle (1') to be placed beside and abut directly against the first rectangular box-shaped footing element (2) below the first instrument cubicle (1).

14. The arrangement according to claim 2, wherein the inlet main pipe (20) and outlet main pipe (21) of the first rectangular box-shaped footing element (2) are terminated with a detachable end piece that can be replaced with a jointing sleeve (15) so as to allow a second rectangular box-shaped footing element (2') below a second instrument cubicle (1') to be placed beside and abut directly against the first rectangular box-shaped footing element (2) below the first instrument cubicle (1).

15. The arrangement according to claim 1, wherein the inlet main pipe (20) and outlet main pipe (21) of the first rectangular box-shaped footing element (2) are extended with a jointing sleeve (15) so as to allow a second rectangular box-shaped footing element (2') of a second instrument cubicle (1') to be placed beside and abut directly against the first rectangular box-shaped footing element (2) below the first instrument cubicle (1).

16. The arrangement according to claim 15, wherein the inlet main pipe (20) and outlet main pipe (21) of the first rectangular box-shaped footing element (2) are terminated with a detachable end piece that can be replaced with a jointing sleeve (15) as to allow a second rectangular box-shaped footing element (2') below a second instrument cubicle (1') to be placed beside and abut directly against the first rectangular box-shaped footing element (2) below the first instrument cubicle (1).

17. The arrangement according to claim 1, wherein the inlet main pipe (20) and outlet main pipe (21) of the first rectangular box-shaped footing element (2) are terminated with a detachable end piece that can be replaced with a jointing sleeve (15) so as to allow a second rectangular box-shaped footing element (2') under a second instrument cubicle (1') to be placed beside and abut directly against the first rectangular box-shaped footing element (2) below the first instrument cubicle (1).

18. The arrangement according to claim 1, wherein the inlet main pipe (20) and the outlet main pipe (21) of the first rectangular box-shaped footing element (2) are terminated with an end piece (22) that comprises venting means (23) and exhaust means (24) for exhausting and venting the inlet main pipe (20) and the outlet main pipe (21).

19. The arrangement according to claim 1, wherein an indication main pipe (26) of the first rectangular box-shaped footing element (2) is made of transparent material to allow easier detection of a possible leakage point.

* * * * *

UNITED STATES PATENT AND TRADEMARK OFFICE
CERTIFICATE OF CORRECTION

PATENT NO. : 8,132,614 B2  
APPLICATION NO. : 11/514179  
DATED : March 13, 2012  
INVENTOR(S) : Tapani Haapamaki Page 1 of 1

It is certified that error appears in the above-identified patent and that said Letters Patent is hereby corrected as shown below:

ON THE TITLE PAGE:

At item (73), Assignee, change "Vacon Oyi, Vaasa (FI)" to --Vacon Oyj, Vaasa (FI)--.

At item (30), Foreign Application Priority Data, change "May 9, 2005" to --September 5, 2005--.

Signed and Sealed this
Twenty-sixth Day of June, 2012

David J. Kappos
*Director of the United States Patent and Trademark Office*